(12) United States Patent
Firnkes et al.

(10) Patent No.: US 10,991,544 B2
(45) Date of Patent: Apr. 27, 2021

(54) CHARGED PARTICLE BEAM DEVICE, OBJECTIVE LENS MODULE, ELECTRODE DEVICE, AND METHOD OF INSPECTING A SPECIMEN

(71) Applicant: ICT Integrated Circuit Testing Gesellschaft für Halbleiterprüftechnik mbH, Heimstetten (DE)

(72) Inventors: Matthias Firnkes, Walpertskirchen (DE); John Breuer, Munich (DE); Florian Lampersberger, Munich (DE); Hanno Kaupp, Erding (DE); Stefan Lanio, Erding (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/425,094

(22) Filed: May 29, 2019

(65) Prior Publication Data
US 2020/0381208 A1  Dec. 3, 2020

(51) Int. Cl.
*H01J 37/285* (2006.01)
*H01J 37/317* (2006.01)
*H01J 37/145* (2006.01)

(52) U.S. Cl.
CPC .......... *H01J 37/285* (2013.01); *H01J 37/145* (2013.01); *H01J 37/3177* (2013.01); *H01J 2237/049* (2013.01)

(58) Field of Classification Search
CPC .... H01J 37/285; H01J 37/145; H01J 37/3177; H01J 2237/049; G03F 7/709; F16F 7/108
See application file for complete search history.

(56) References Cited

U.S. PATENT DOCUMENTS

| | | | | |
|---|---|---|---|---|
| 4,418,898 A * | 12/1983 | Atsumi | ................ | B60K 5/1208 267/141.1 |
| 5,518,347 A * | 5/1996 | Cobb, Jr. | .............. | B23B 29/022 409/141 |
| 6,283,041 B1 * | 9/2001 | Ono | ....................... | B82Y 10/00 108/20 |
| 9,134,632 B2 * | 9/2015 | Van Der Wijst | .... | G03F 7/70258 |
| 2005/0066767 A1 * | 3/2005 | Patterson | ................ | F16F 7/108 74/574.2 |
| 2005/0253317 A1 * | 11/2005 | Yasumoto | ............... | F16F 7/108 267/140.11 |
| 2008/0278828 A1 * | 11/2008 | Rau | ........................ | G02B 7/001 359/811 |
| 2011/0174985 A1 * | 7/2011 | Peijster | ............... | H01J 37/3177 250/400 |

(Continued)

*Primary Examiner* — Sean M Luck
(74) *Attorney, Agent, or Firm* — Kilpatrick Townsend & Stockton LLP

(57) ABSTRACT

A charged particle beam device for inspecting a specimen is described. The charged particle beam device includes a beam source for emitting a charged particle beam, an electrode for influencing the charged particle beam, and a damping unit provided on the electrode for damping vibrations of the electrode. Further, an objective lens module with an electrode is described, wherein a damping unit is provided on the electrode. Further, an electrode device is described, wherein a mass damper is mounted on a disk-shaped electrode body of the electrode device.

21 Claims, 4 Drawing Sheets

(56) References Cited

U.S. PATENT DOCUMENTS

| | | | | |
|---|---|---|---|---|
| 2011/0272229 | A1* | 11/2011 | Kobayashi | F16F 7/1011 188/379 |
| 2012/0241640 | A1* | 9/2012 | Ward | H01J 37/28 250/396 R |
| 2014/0202812 | A1* | 7/2014 | Hauf | F16F 7/1011 188/380 |
| 2014/0333915 | A1* | 11/2014 | Hoogkamp | H01J 37/32339 355/67 |
| 2015/0107948 | A1* | 4/2015 | Gustavsson | F16F 7/108 188/380 |
| 2015/0153659 | A1* | 6/2015 | Nawata | G03F 7/709 355/72 |
| 2015/0316854 | A1* | 11/2015 | Gruner | G03F 7/7015 355/71 |
| 2016/0045960 | A1* | 2/2016 | Hecht | B23B 27/08 407/66 |
| 2016/0111265 | A1* | 4/2016 | Siegert | H01J 37/3435 204/298.12 |
| 2016/0273605 | A1* | 9/2016 | Endo | F16F 7/108 |
| 2017/0010543 | A1* | 1/2017 | Aangenent | H01L 21/68 |
| 2017/0211655 | A1* | 7/2017 | Chaen | F16M 11/22 |
| 2017/0370441 | A1* | 12/2017 | Evers | F16F 15/027 |
| 2018/0017125 | A1* | 1/2018 | Amdisen | F16F 7/108 |
| 2018/0156291 | A1* | 6/2018 | Seno | F16F 1/3732 |

* cited by examiner

CHARGED PARTICLE BEAM DEVICE, OBJECTIVE LENS MODULE, ELECTRODE DEVICE, AND METHOD OF INSPECTING A SPECIMEN

TECHNICAL FIELD

Embodiments of the present disclosure relate to a charged particle beam device for inspecting a specimen. Specifically, the charged particle beam device may be an electron microscope, e.g. a scanning electron microscope, for inspecting a specimen, e.g. a semiconductor wafer. Embodiments further relate to an objective lens module for focusing a charged particle beam on a specimen, an electrode device for influencing a charged particle beam of a charged particle beam device, and a method of inspecting a specimen with a charged particle beam device, particularly with an electron microscope.

BACKGROUND

Charged particle beam devices have many functions in a plurality of industrial fields, including, but not limited to, electron beam inspection (EBI), critical dimension (CD) measurements of semiconductor devices, defect review (DR) of semiconductor devices, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to the short wavelengths.

In a typical charged particle beam device, a charged particle beam is generated by a beam source and influenced by a plurality of beam influencing elements, e.g. one or more condenser lenses, deflectors, beam separators, aberration correctors, objective lenses and/or scan deflectors, which may generate electric and/or magnetic fields for influencing the charged particle beam. For example, the charged particle beam device is collimated by a condenser lens system, deflected toward an objective lens by a beam deflector, and focused on a specimen by an objective lens module. A scan deflector may be provided for scanning the charged particle beam over the surface of the specimen. Signal particles generated by the interaction of the charged particle beam with the specimen can be extracted and detected with at least one detector device for obtaining spatial information about the specimen or for detecting defective locations on the specimen.

Defect inspection in semiconductor technology benefits from high resolution and fast inspection tools. Electron beams can be used for a high-resolution inspection of samples, e.g., so as to be able to quickly detect small defects of large wafers. However, it is challenging to inspect specimens at a very high resolution, e.g. in the sub-µm or nm-range, because external influences such as acoustic noise, mechanical interferences, or pressure variations may negatively affect the alignment accuracy and the beam stability. Known charged particle beam devices may be supported on a special support in order to isolate the charged particle beam device from external influences. Yet, improving the resolution would still be beneficial.

In view of the above, it would be beneficial to provide a charged particle beam device, an objective lens module and an electrode device that allow for a reduction of external influences on a charged particle beam, such that better resolutions can be obtained.

SUMMARY

In light of the above, a charged particle beam device, an objective lens module, an electrode device, and a method of inspecting a specimen with a charged particle beam device are provided. Further aspects, advantages, and features are apparent from the dependent claims, the description, and the accompanying drawings.

According to an aspect described herein, a charged particle beam device for inspecting a specimen is provided. The charged particle beam device includes a beam source for emitting a charged particle beam, an electrode for influencing the charged particle beam, and a damping unit provided on the electrode for damping vibrations of the electrode.

According to another aspect described herein, an objective lens module for focusing a charged particle beam on a specimen is provided. The objective lens module includes a housing, an electrode, at least one axially extending holder that holds the electrode at the housing, and a damping unit provided on the electrode for damping vibrations of the electrode.

According to another aspect described herein, an electrode device for influencing a charged particle beam in a charged particle beam device is provided. The electrode device includes a disk-shaped electrode body, and a mass damper mounted on the disk-shaped electrode body for damping vibrations of the disk-shaped electrode body.

In some embodiments, the electrode device is configured for at least one of focusing a charged particle beam on a specimen and generating an extraction field for signal electrons above the specimen. For example, the electrode device may be a part of an objective lens module, particularly a proxy electrode.

According to another aspect described herein, a method of inspecting a specimen with a charged particle beam device is provided. The method includes generating a charged particle beam propagating along an optical axis, influencing the charged particle beam with an electrode, and damping vibrations of the electrode with a damping unit provided on the electrode.

The damping unit of embodiments described herein may include a mass damper that is mounted on the electrode.

Embodiments described herein are also directed at apparatuses for carrying out the disclosed methods and include apparatus parts for performing each described method feature. The method features may be performed by way of hardware components, a computer programmed by appropriate software, by any combination of the two or in any other manner. Furthermore, embodiments are also directed at methods with which the described apparatus operates. It includes method features for carrying out every function of the apparatus.

BRIEF DESCRIPTION OF THE DRAWINGS

So that the manner in which the above recited features can be understood in detail, a more particular description, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Without limiting the scope of protection, the charged particle beam device or components thereof will exemplarily be referred to herein as an electron beam device configured for the detection of signal electrons, e.g. secondary electrons and/or backscattered electrons. The embodiments described herein can still be applied for apparatuses and components detecting corpuscles such as secondary and/or backscattered charged particles in the form of electrons or ions, photons, X-rays or other signals in order to obtain a sample image or inspection result.

A "specimen", "sample" or "wafer" as referred to herein includes, but is not limited to, semiconductor wafers, semiconductor workpieces, and other workpieces such as memory disks and the like. Embodiments may be applied to any workpiece which is structured or on which material is deposited. A specimen, a sample or wafer includes a surface to be imaged and/or structured or on which layers are deposited. According to some embodiments, which can be combined with other embodiments described herein, the apparatus and methods are configured for or are applied for electron beam inspection (EBI), critical dimension (CD) measurement and defect review (DR) applications, where the microscopes and methods according to embodiments described herein can be beneficially used. According to some embodiments described herein, an electron beam inspection tool, critical dimension measurement tool, and/or defect review tool can be provided, wherein high resolution, large field of view, and high scanning speed can be achieved.

Figure 1:
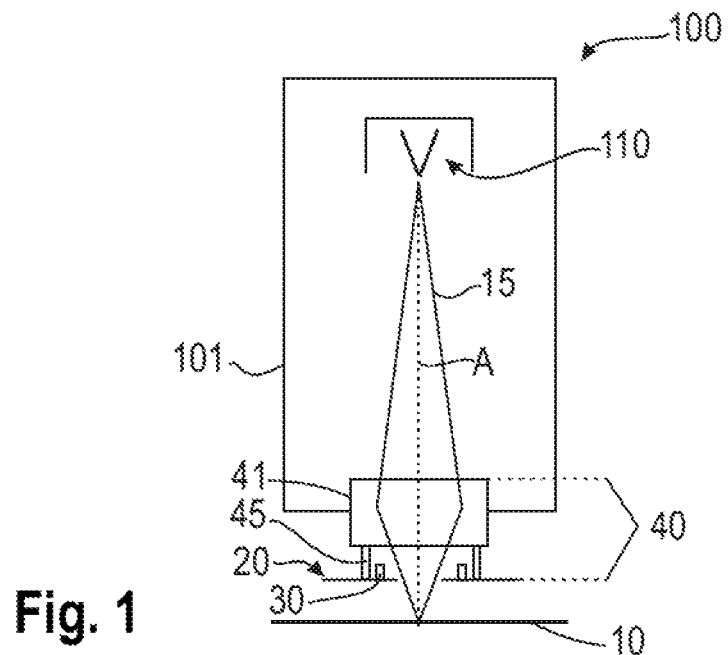
FIG. 1 shows a schematic sectional view of a charged particle beam device according to embodiments described herein.

FIG. 1 shows a charged particle beam device 100, e.g. an electron microscope, for inspecting a specimen, e.g. a wafer, according to embodiments described herein. The charged particle beam device 100 includes a beam source 110 for generating a charged particle beam 15, e.g. an electron beam. The charged particle beam 15 may be directed along an optical axis A toward an objective lens module 40 to be focused on the specimen 10 that is to be inspected.

The charged particle beam device 100 includes an electrode 20 for influencing the charged particle beam 15. For example, the electrode 20 may be configured for at least one of focusing and deflecting the charged particle beam 15. The electrode 20 can be set on a specific electric potential, such that an electric field, e.g. an electrostatic field or an electromagnetic field, can be generated for influencing the charged particle beam 15. A voltage source may be connected to the electrode 20 for applying a specific voltage level to the electrode.

In some embodiments, the electrode 20 is configured for focusing the charged particle beam 15 on the specimen 10 and/or for generating an extraction field for signal electrons above the specimen. For example, the electrode 20 may be a part of an objective lens module 40 configured to focus the charged particle beam 15 on the specimen, and/or may generate an extraction field for signal electrons above the specimen, such that the signal electrons are directed toward a detector device.

The electrode 20 may be arranged close to the specimen 10 during the operation of the charged particle beam device, e.g. at a distance of 1 cm or less, particularly 5 mm or less, or even 2 mm or less. In this case, the electrode 20 can also be referred to as a "proximity electrode" or a "proxy electrode", i.e. an electrode that is arranged in close proximity to the specimen to be inspected. For example, the electrode 20 may be arranged between a housing 41 of the objective lens module 40 and a specimen stage that is configured for supporting the specimen 10.

In some embodiments, the electrode 20 is configured for at least one of deflecting, collimating, and focusing the charged particle beam. Alternatively or additionally, the electrode may be an extraction electrode configured for generating an extraction field for signal electrons above the specimen. Alternatively or additionally, the electrode 20 may be a part of a correction device configured for correcting aberrations of the charged particle beam, e.g. spherical and/or chromatic aberrations.

In the embodiment depicted in FIG. 1, the electrode 20 is a part of the objective lens module 40 that is configured for focusing the charged particle beam 15 on the specimen. Specifically, in FIG. 1, the electrode 20 is a proxy electrode of the objective lens module 40 that is arranged in the proximity of the specimen to be inspected. In other embodiments, the electrode may be located between the beam source and an objective lens module, i.e. upstream of the objective lens module with respect to the propagation direction of the charged particle beam 15.

In some embodiments, a plurality of electrodes are provided, e.g. electrodes for one or more of collimating, deflecting, focusing, and extracting charged particles.

The electrode 20 may have at least one opening for allowing a propagation of the charged particle beam 15 through the electrode 20, e.g. through a center of the electrode. The at least one opening may be arranged in the center of the electrode 20 and may be intersected by the optical axis A. Signal electrons may be accelerated through the opening toward a detector device.

In some embodiments, the electrode may have a plurality of openings for a plurality of charged particle beams. In particular, the electrode may be configured for influencing a plurality of charged particle beams (or "beamlets") that may propagate through a plurality of openings of the electrode. For example, the electrode may have two or more openings, particularly three or more openings, more particularly five or more openings, or even ten or more openings for the plurality of charged particle beams (or "beamlets") that may propagate through the electrode. In particular, the charged particle beam device may be a multibeam apparatus with a multibeam column for directing a plurality of charged particle beams (or "beamlets") on a specimen, e.g. on a common spot or on a plurality of different spots. In an embodiment, the beam source is configured for emitting a plurality of charged particle beams (or "beamlets"), e.g. by directing a primary beam through an aperture plate. Alternatively, a plurality of separate beam sources for emitting the plurality of charged particle beams may be provided, wherein at least one or more of the plurality of charged particle beams may be directed through one or more openings of the electrode or through a plurality of separate electrodes arranged in parallel.

In some embodiments, the electrode 20 may include at least one opening for allowing the propagation of a plurality of charged particle beams (or "beamlets") through the at least one opening. For example, two, three or more beamlets generated by the same beam source or by different beam sources may be influenced by being directed through the same opening of the electrode 20.

During the operation of the charged particle beam device, external influences such as acoustic noise and mechanical vibrations may lead to mechanical vibrations inside the column of the charged particle beam device. It may help to support the charged particle beam device on a damped support, e.g. on a vibration-damped table, which isolates the charged particle beam device from external influences to some extent. However, mechanical vibrations at specific positions inside the charged particle beam device may remain and may distort the charged particle beam, negatively affecting the obtainable resolution. Mechanical vibrations may be particularly disturbing in high-resolution microscope devices and may prevent a high resolution in the sub-μm or nm-range. In particular, undesired movements of electrodes that are configured to focus the charged particle beam on the specimen with a small spot size and/or electrodes that are arranged at close distance to the specimen may have a particularly negative effect on the resolution.

According to embodiments described herein, a damping unit 30 is provided on the electrode 20 for damping vibrations of the electrode 20. Specifically, the damping unit 30 may be mounted directly on the electrode 20, e.g. at a body of the electrode. By providing at least one damping unit on the electrode, electrode vibrations can be reliably dampened and beam distortions can be reduced, improving the achievable resolution of the device. By mounting a damping unit 30 on a focusing electrode that may be a part of the objective lens module 40, vibrations of the electrode can be reduced, such that a more stable beam position and a more accurate focal spot on the specimen can be obtained.

In some implementations, different vibration modes of the electrode 20 can be dampened by providing the damping unit 30 on the electrode 20. Vibration modes may include so-called "drum modes" in which at least a part of the electrode oscillates in a direction along the optical axis, and so-called "lateral modes" in which the electrode oscillates in a lateral direction, i.e. transverse to the optical axis A. Drum modes of, e.g., a focusing electrode may lead to a defocusing of the charged particle beam on the specimen. In a multibeam apparatus, drum modes may also cause a lateral motion of at least one or more of the charged particle beams propagating through the electrode. By providing a damping unit on the electrode that dampens one or more drum modes of the electrode, the focal spot on the specimen can be improved, e.g. reduced and maintained in size. By providing a damping unit on the electrode that dampens one or more lateral modes, a lateral shift of the focal spot on the specimen can be reduced or avoided, such that the focal spot on the specimen can be stabilized. The resolution of the device can be improved.

According to some embodiments, which may be combined with other embodiments described herein, the damping unit 30 may be a passive damper, particularly a mass damper, i.e. a damping unit with a damping mass. The mass damper including the damping mass can be directly mounted on a body of the electrode 20.

Specifically, in some embodiments, the mass damper may include a damping mass and an elastic element arranged at least partially between the damping mass and the electrode. Accordingly, vibrations of the electrode body will induce vibrations of the damping mass relative to the electrode body, and the elastic element can be configured for absorbing a vibration energy of the damping mass, which dissipates as heat. Thus, electrode vibrations are effectively damped.

A damping unit 30 configured as a mass damper is particularly suitable for damping electrode vibrations in a charged particle beam device, because a mass damper can be provided as a small, passive unit that can be directly placed on the body whose vibrations are to be damped (i.e., on the electrode body). The mass damper can be configured to dampen vibrations in a frequency range below 2000 Hz by providing a damping mass with an appropriate weight and/or an elastic element with an appropriate elasticity. Further, a mass damper is typically only mounted at the body whose vibrations are to be damped, and not between two objects that can vibrate relative to each other (such as the electrode and a support of the electrode). This is beneficial because the mass damper can be placed on the electrode such that the mass damper is in contact only with the electrode that may be provided on a high voltage in the range of many kilovolts. The risk of voltage flashovers can be reduced, because the mass damper does not act between the electrode and another object that supports the electrode. Yet further, mass dampers are passive mechanical units that are suitable for being placed in a vacuum environment, and there is no need for power supply or signal transmission.

According to some embodiments, which can be combined with other embodiments described herein, the electrode 20 is configured for at least one of focusing the charged particle beam on the specimen 10 and generating an extraction field for signal electrons above the specimen 10. In some implementations, the charged particle beam device includes an objective lens module 40 for focusing the charged particle beam device on the specimen, and the electrode is a part of the objective lens module. For example, the electrode 20 is held in proximity to the specimen during the operation of the charged particle beam device, e.g. at a distance of 1 cm or less, particularly 5 mm or less, or even 2 mm or less.

In some embodiments, which can be combined with other embodiments described herein, the objective lens module 40 may be a magnetic-electrostatic objective lens that includes one or more electrodes and one or more magnets, e.g. electromagnets. The voltage applied to the electrode 20 as compared to a specimen voltage may define the extraction field for signal electrodes above the specimen. Further, the charged particle beam can be focused with the objective lens module, wherein the electrode 20 may provide or contribute to a focusing effect.

The objective lens module 40 may be a retarding field device configured to decelerate the charged particles before the charged particles hit the specimen. The voltage applied to the electrode 20 as compared to a voltage of the housing 41 of the objective lens module and/or of a column 101 of the charged particle beam device may define the strength of the retarding field acting on the charged particle beam before impingement on the specimen.

In some embodiments, the column 101 and/or the housing 41 of the objective lens module 40 may be provided at ground potential, and the electrode 20 and/or the specimen 10 may be at a high potential, e.g. 1 kV or more, particularly 10 kV or more, or even 30 kV or more. Accordingly, a potential difference may be provided between the housing 41 and the electrode 20, having the effect of a retarding field on the charged particles.

In order to hold the electrode 20 in close proximity to the specimen 10 during the operation of the charged particle beam device, the electrode 20 may be connected to a support via at least one axially extending holder 45. For example, in the embodiment depicted in FIG. 1, the electrode 20 is held at the housing 41 of the objective lens module 40 by several axially extending holders. The at least one axially extending holder 45 may include an isolating material, such that the electrode 20 and the support of the electrode, e.g. the housing 41, can be provided at different electric potentials during the operation of the device.

An "axially extending holder" as used herein may refer to a holder that extends at least partially along the optical axis A, e.g. parallel to the optical axis A or at an angle with respect to the optical axis A, the angle being different from 90°. By providing the axially extending holder 45, the electrode can be brought in close proximity to the specimen. However, the electrode may be more susceptible to lateral vibrations as compared to an electrode that is held by a holder that supports the electrode at a circumferential edge of the electrode. According to embodiments described herein, lateral vibration modes of the electrode are dampened by providing the damping unit 30 on the electrode 20.

Figure 2:
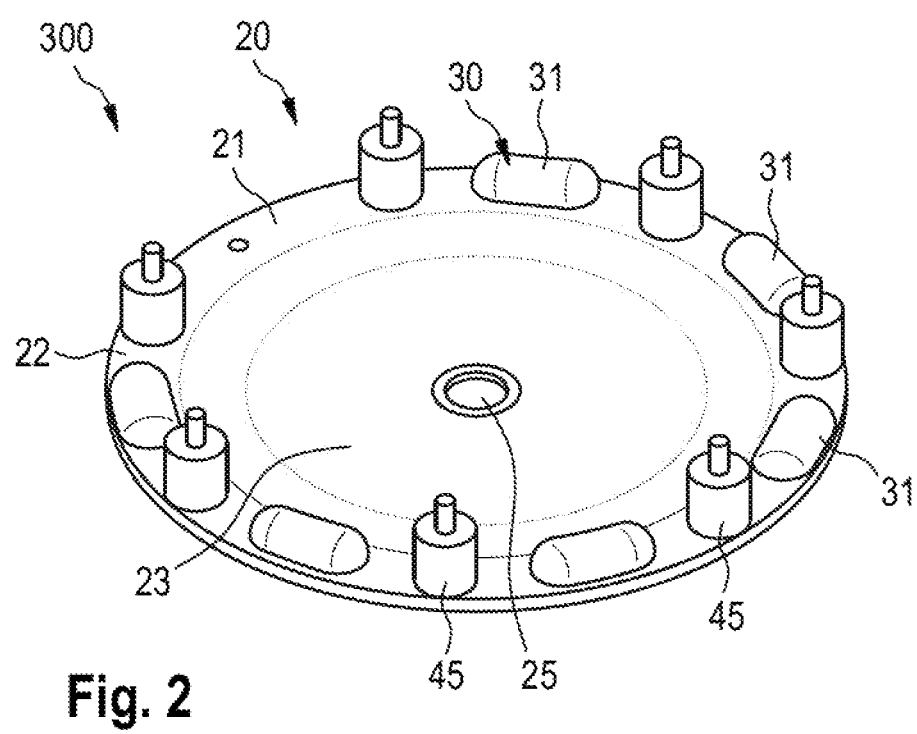
FIG. 2 shows a perspective view of an electrode device according to embodiments described herein.

FIG. 2 is a perspective view of an electrode device 300 configured for influencing a charged particle beam in a charged particle beam device, according to embodiments described herein. The electrode device 300 includes an electrode 20 and a damping unit 30 that may correspond to the electrode and the damping unit of the charged particle beam device 100 described with respect to FIG. 1, such that reference can be made to the above explanations, which are not repeated here. In some embodiments, the electrode device 300 is configured for at least one of focusing a charged particle beam on a specimen and generating an extraction field for signal electrons above the specimen.

In some embodiments, the electrode device 300 includes an electrode body, particularly a disk-shaped electrode body 21, and a damping unit 30 mounted on the disk-shaped electrode body 21 for damping vibrations of the disk-shaped electrode body 21. The damping unit 30 may be a mass damper.

The disk-shaped electrode body 21 may include an opening 25 for the charged particle beam that is typically arranged in the center of the disk-shaped electrode body. The charged particle beam can propagate through the opening 25 along the optical axis of the charged particle beam device. A predetermined voltage can be applied to the disk-shaped electrode body 21, in order to influence the charged particle beam that propagates through the opening 25.

In some embodiments, which can be combined with other embodiments described herein, a plurality of damping units, particularly a plurality of mass dampers 31 is mounted on the disk-shaped electrode body 21. The plurality of mass dampers 31 may be configured in accordance with any of the mass dampers described herein. In particular, each of the mass dampers may include a damping mass and an elastic element. By providing a plurality of mass dampers on the electrode, a larger amount of vibration energy can be absorbed, such that electrode vibrations can be more effectively dampened.

In the embodiment depicted in FIG. 2, the plurality of mass dampers 31 includes two or more, particularly four or more, more particularly six or more mass dampers mounted on the electrode 20. For example, the plurality of mass dampers 31 can be mounted on a circumferential edge region 22 of the disk-shaped electrode body 21, respectively. By placing the plurality of mass dampers 31 directly on the disk-shaped electrode body, lateral vibration modes and drum vibration modes of the disk-shaped electrode body can be reliably dampened.

In some embodiments, the electrode device 300 may include at least one axially extending holder 45 for holding the electrode device 300 at a support, e.g. at a housing or column of the charged particle beam device. In the embodiment depicted in FIG. 2, a plurality of axially extending holders is provided, e.g. two, three, five or more holders, particularly seven or more holders. The holders may include an isolating material, such that the electrode device 300 can be connected to a support that is provided at a different electrical potential than the disk-shaped electrode body 21. For example, the electrode device 300 can be connected to and held by the housing of an objective lens module, the housing being grounded.

By providing a plurality of holders for supporting the electrode device, the electrode device can be stably held by a support, as is schematically depicted in FIG. 1. Vibrations that may nevertheless be transmitted to the electrode can be reliably dampened by the plurality of mass dampers 31. In some embodiments, the plurality of mass dampers 31 and a plurality of axially extending holders for holding the electrode device may be mounted on the circumferential edge region 22 of the disk-shaped electrode body 21. Some of the mass dampers may be arranged between two axially extending holders, respectively. Accordingly, vibrations transmitted to the electrode body via the axially extending holders can be effectively dampened by the plurality of mass dampers 31.

Figure 3:
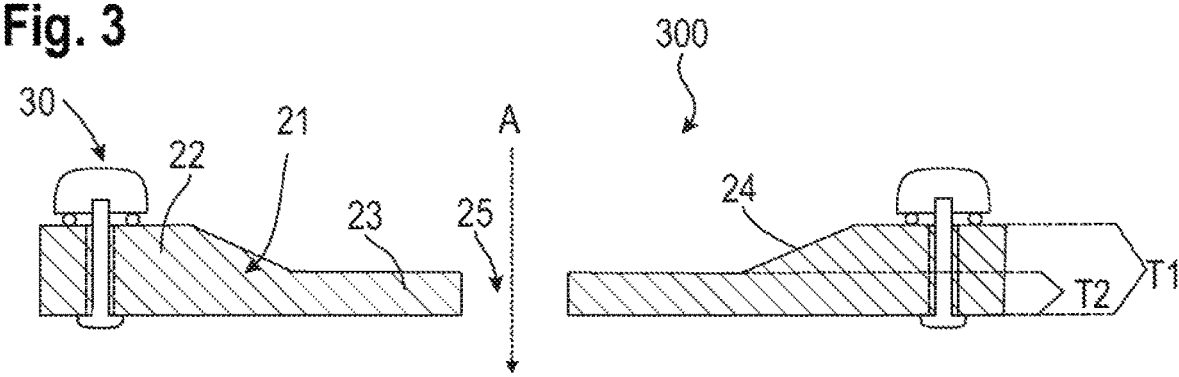
FIG. 3 shows a schematic sectional view of an electrode device according to embodiments described herein.

FIG. 3 shows a schematic sectional view of an electrode device 300 according to embodiments described herein. The electrode device of FIG. 3 may be similar to or correspond to the electrode device depicted in FIG. 2, such that reference can be made to the above explanations, which are not repeated here.

The electrode device 300 may be configured for at least one of focusing a charged particle beam on a specimen and generating an extraction field for signal electrons above the specimen. A damping unit 30, particularly a mass damper, is arranged on the disk-shaped electrode body 21 of the electrode device. In some embodiments, a plurality of mass dampers is mounted on the disk-shaped electrode body 21. Two mass dampers are depicted in the sectional view of FIG. 3 on opposite sides of the optical axis A.

In some embodiments, which can be combined with other embodiments described herein, the disk-shaped electrode body 21 has a circumferential edge region 22 and a center region 23. The center region 23 may include the opening 25 for the charged particle beam. A plurality of mass dampers may be arranged on the circumferential edge region 22.

The circumferential edge region 22 may have a first thickness T1, and the center region 23 may have a second thickness T2, the second thickness T2 being smaller than the first thickness T1. For example, the first thickness T1 may be 5 mm or more, e.g. about 6 mm, and/or the second thickness T2 may be 3 mm or less, e.g. about 2 mm. In particular, the disk-shaped electrode body may have a rim region that is at least partially thicker than the center region, where the opening 25 is provided. By providing a thick rim region of the disk-shaped electrode body, the amplitudes of electrode vibrations can be reduced and/or the vibration frequencies of normal vibration modes of the electrode can be increased. Typically, amplitudes of vibration modes having a high vibration frequency are smaller than amplitudes of vibration modes having a low vibration frequency. Increasing the mass of the disk-shaped electrode body by providing a thick rim region can increase the stiffness of the electrode body, reducing the vibration amplitudes. The up/down vibration modes (i.e. the drum modes) of the electrode can be attenuated by providing an electrode with a small thickness only in a center region 23 of the electrode body.

In some embodiments, the diameter of the disk-shaped electrode may be 10 cm or more, particularly 20 cm or more, or even 30 cm or more. A large-diameter electrode may be more susceptible to drum modes as compared to small-diameter electrodes. The amplitudes of drum modes can be reduced by at least partially increasing the thickness of the disk-shaped electrode body, particularly in a radially outer part of the body, where the electrode is mounted by at least one axially extending holder.

Specifically, it is beneficial to make the electrode thicker in an outer region of the electrode where the electrode is mounted, such that any excitation that is transmitted to the electrode via the mounts enters the electrode at a region where the electrode is stiff.

In some implementations, a transition region 24 which is optionally essentially conically shaped, may be provided between the circumferential edge region 22 and the center region 23, as is schematically depicted in FIG. 3. In the transition region 24, the thickness of the disk-shaped electrode body may gradually increase in a radial direction, e.g. from the second thickness T2 of the center region 23 to the first thickness T1 of the circumferential edge region 22.

By providing a plurality of damping units on the disk-shaped electrode body, both drum modes and lateral modes of the electrode can be effectively dampened and the obtainable resolution can be improved.

As is schematically depicted in FIG. 3, the damping unit 30 may be a mass damper with a damping mass that is mounted on the disk-shaped electrode body. Details of an exemplary mass damper will be described with reference to FIG. 4.

Figure 4:
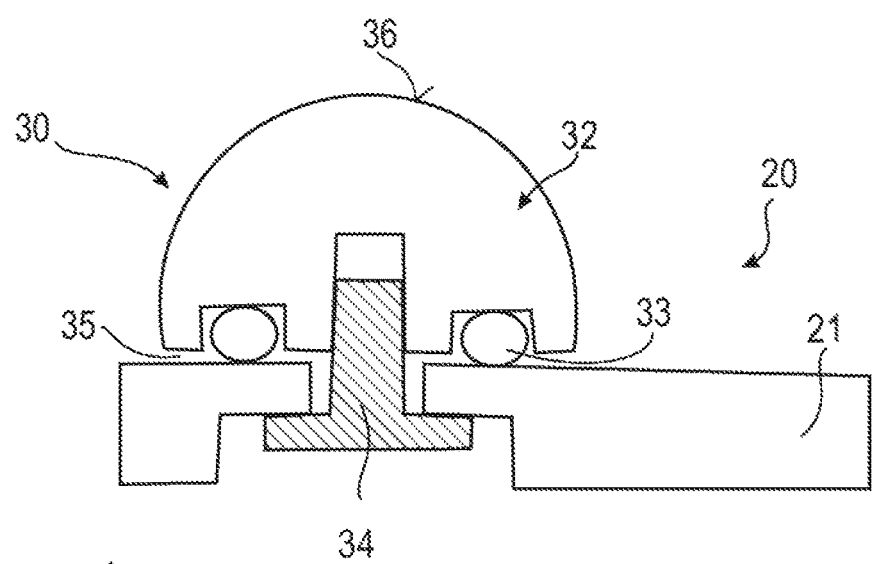
FIG. 4 shows a part of an electrode device according to embodiments described herein in a sectional view.

FIG. 4 shows a part of an electrode device with a damping unit 30 mounted thereon in an enlarged sectional view. The damping unit 30 depicted in FIG. 4 may be used in any of the charged particle beam devices described herein.

The damping unit 30 depicted in FIG. 4 is a mass damper that is provided on a disk-shaped electrode body 21 of an electrode 20. The mass damper includes a damping mass 32 and an elastic element 33. The elastic element 33 may be arranged at least partially between the damping mass 32 and the electrode 20. The damping mass may be mounted on the electrode such that the damping mass can be excited to vibrations relative to the electrode when the electrode vibrates. The elastic element 33 may be configured for absorbing a vibration energy of the damping mass 32 and/or of the electrode 20, which may dissipate as heat. Accordingly, vibrations of the electrode can be effectively damped.

In some embodiments, which may be combined with other embodiments described herein, the damping mass 32 is held at a distance from the electrode 20 by a connection element 34, particularly by a screw, pin or bolt. The connection element 34 may extend at least partially through the disk-shaped electrode body 21 of the electrode and may hold the damping mass 32 above a surface of the electrode, e.g. at a distance thereto (e.g., 1 mm, 0.5 mm or less). By holding the damping mass at a small distance from the electrode, the damping mass can more easily be excited into vibrations relative to the electrode, e.g. vibrations along the optical axis A, vibrations transverse to the optical axis A, and/or a combination thereof. Specifically, the small gap between the damping mass and the electrode may allow for a vibrational motion of the damping mass relative to the electrode.

The elastic element 33 may be provided in a gap 35 between the electrode 20 and damping mass 32. Further, the elastic element 33 may be provided at least in indirect contact with the electrode and the damping mass. This allows for the vibration energy of the damping mass and/or of the electrode to be more effectively absorbed and transformed into heat via the elastic element 33. The damping strength of the mass damper depends on the elasticity of the elastic element. Providing a stiffer elastic element will reduce the damping effect of the mass damper.

The connection element 34 may include a conductive material, e.g. a metal. In particular, the connection element 34 may be a metal pin, a metal screw, or a metal bolt. This ensures an electrical connection between the electrode 20 and the damping mass 32 and avoids that the damping mass 32 is on a floating potential when a high voltage is applied to the electrode 20.

In some embodiments, the elastic element 33 is an elastomer ring or an O-ring that surrounds the connection element 34, as is schematically depicted in FIG. 4. For example, the damping mass 32 is held above a surface of the electrode by a screw or bolt, and an O-ring surrounding the screw or bolt acts in a gap between the damping mass 32 and the electrode 20. An effective damping unit that is easy to install and maintenance-friendly can be provided.

In some implementations, a surface 36 of the damping unit 30 protruding away from the electrode 20 is at least one of rounded, edge-free, corner-free, and polished. For example, the surface 36 of the damping mass 32 that is directed away from the disk-shaped electrode body 21 may be rounded, such that no sharp edges and corners are provided. Accordingly, a negative effect of the damping unit on the electric field generated by the electrode can be reduced or avoided. Specifically, the electric field strength between the electrode and a housing of the objective lens module is not negatively affected by providing a damping mass with a rounded surface.

The damping unit 30 may be configured to dampen vibration modes of the electrode in a frequency range from 300 Hz to 2000 Hz, particularly in a frequency range between 300 Hz and 1000 Hz.

Figure 5:
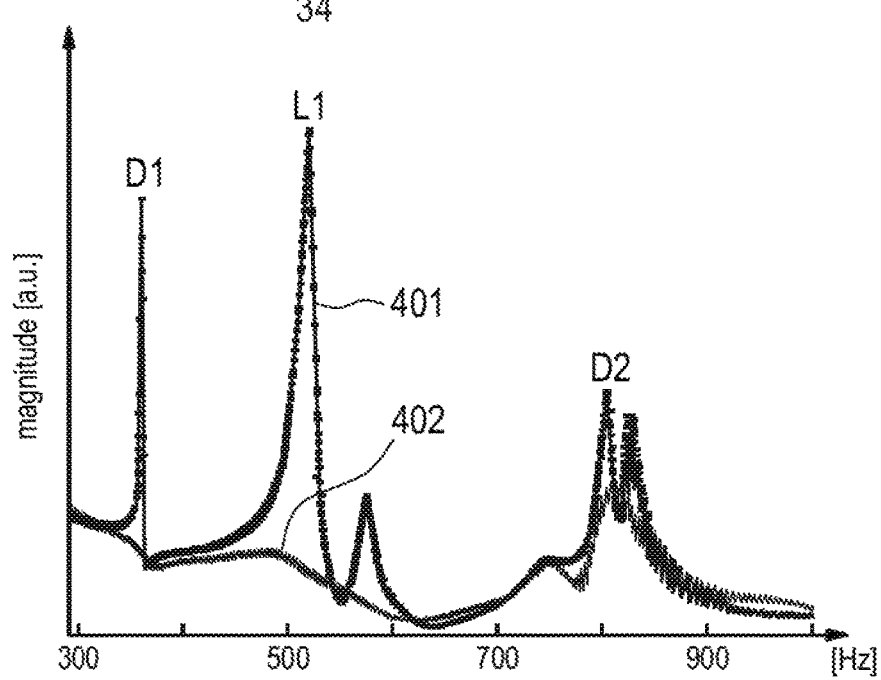
FIG. 5 is a graph illustrating the oscillatory behavior of an electrode in a charged particle beam device according to embodiments described herein.

FIG. 5 is a graph illustrating the oscillatory behavior of an electrode in a charged particle beam device according to embodiments described herein. The x-axis shows the frequency in Hertz in a frequency range from 300 Hz to 1000 Hz, and the y-axis shows a relative magnitude of electrode vibrations in arbitrary units.

Line 401 shows the oscillatory behavior of an undamped electrode, i.e. an electrode without a damping unit. The vibration curve shows a first peak at about 350 Hz corresponding to a first drum mode D1 (fundamental or zero order drum mode) of the electrode, a second peak at a frequency of about 500 Hz corresponding to a first lateral mode (fundamental or zero order lateral mode) of the electrode, and a third peak at a frequency of about 800 Hz corresponding to a second drum mode D2 (first order drum mode) of the electrode. The oscillation amplitudes are typically lower for higher order natural modes of the electrode above 1000 Hz that are not shown in FIG. 5. Without damping, the electrode can be excited to high-amplitude vibrations at the natural frequencies of the electrode from 300 Hz to 1000 Hz depicted in FIG. 5, as is illustrated by line 401.

Line 402 shows the oscillatory behavior of the same electrode, wherein six mass dampers are provided on the electrode. Specifically, the oscillatory behavior of the electrode device 300 of FIG. 2 is shown. As is clearly visible from FIG. 5, in the frequency range of interest, essentially all the resonances of the electrodes, particularly the first drum mode D1 and the first lateral mode L1, are substantially dampened. A vibration-reduced electrode or an essentially vibration-free electrode can be provided.

Figure 6:
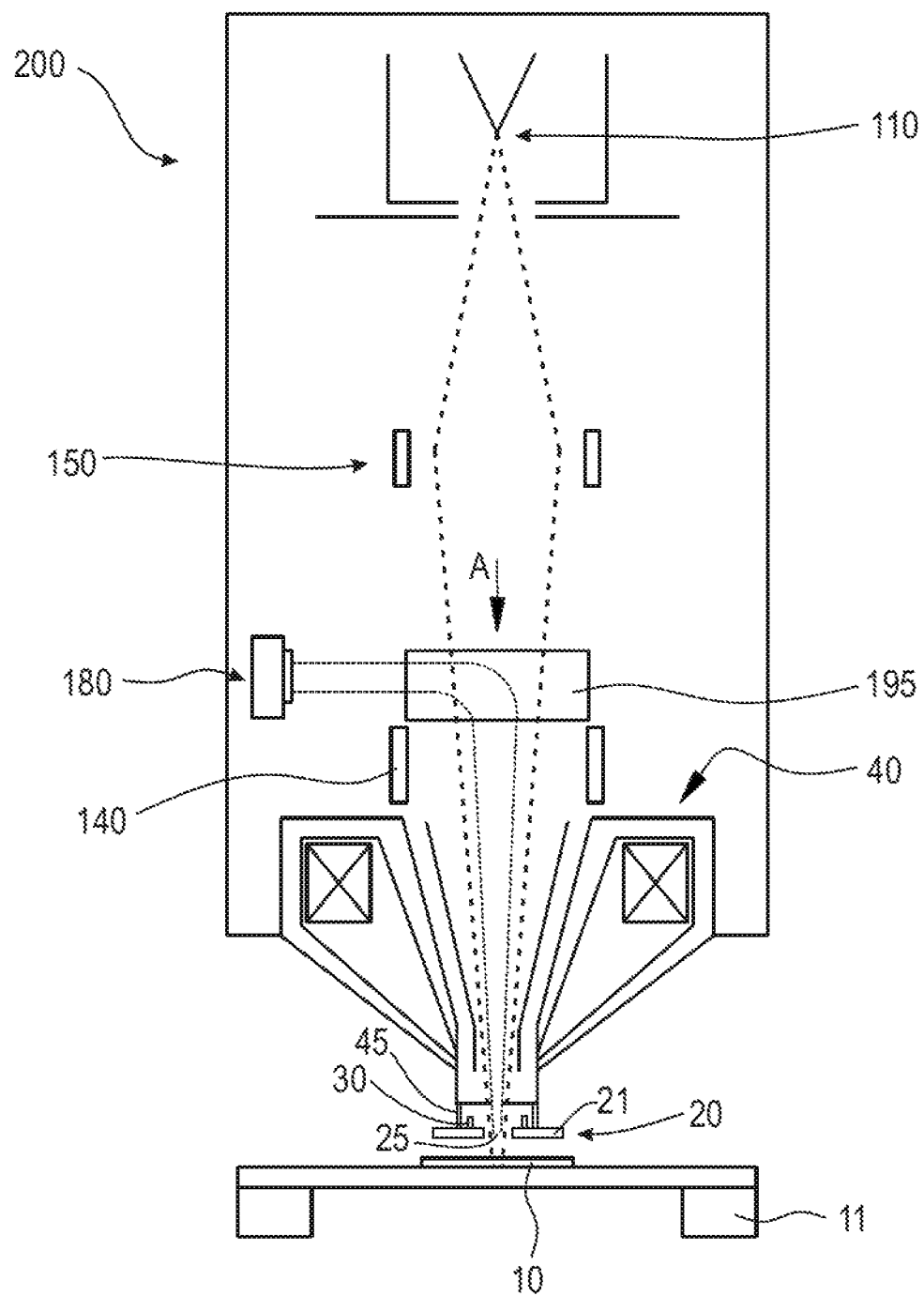
FIG. 6 shows a schematic sectional view of a charged particle beam device with an objective lens module according to embodiments described herein.

FIG. 6 shows a schematic sectional view of a charged particle beam device 200 according to embodiments described herein. The charged particle beam device 200 may be similar to the charged particle beam device 100 of FIG. 1, such that reference can be made to the above explanations, which are not repeated here. The charged particle beam device 200 may be a scanning electron microscope (SEM).

The charged particle beam device 200 includes a beam source 110 for emitting a charged particle beam, a collimator lens 150 for collimating the charged particle beam, a scan deflector 140 for scanning the charged particle beam over a surface of the specimen 10, and an objective lens module 40 for focusing the charged particle beam on the specimen. The specimen 10 may be a wafer that is placed on a specimen stage 11 which may be movable.

Signal electrons emitted from the specimen and directed back through the objective lens module 40 may be separated from the charged particle beam 15 by a beam separator 195 and detected by a detector device 180. Spatial information about the specimen 10 can be obtained.

In some embodiments, the objective lens module 40 may be an electrostatic-magnetic objective lens including a magnetic lens part and an electrostatic lens part. The electrostatic lens part may include an electrode 20, wherein a damping unit 30 is provided on the electrode 20 for damping vibrations of the electrode. A plurality of damping units, particularly a plurality of mass dampers, may be provided on the electrode 20.

In some embodiments, the charged particle beam device includes further electrodes, and damping units may be mounted on at least one of the further electrodes.

In some embodiments, which can be combined with other embodiments described herein, the objective lens module 40 includes a housing and at least one axially extending holder 45 that holds the electrode at the housing. The electrode 20 may be a proxy electrode that is to be arranged close to the specimen to be inspected, such that the electrode 20 can generate an extraction field for the signal electrons above the specimen. The voltage applied to the electrode 20 may define the extraction field for the signal electrodes above the specimen. Further, the electrode 20 may be a part of the electrostatic lens part of the objective lens module 40.

The electrode 20 may be connected to the housing of the objective lens module 40 by a plurality of axially extending holders. The axially extending holders may include an isolating material, such that a voltage difference can be applied between the housing 41 and the electrode 20. For example, the electrode 20 may be configured for a voltage difference with respect to the housing 41 of the objective lens module of 1 kV or more, particularly 10 kV or more, or even 30 kV or more. In an embodiment, the housing 41 is grounded, and a negative voltage of 30 kV or more may be applied to the electrode 20 for decelerating the charged particles of the charged particle beam before hitting the specimen.

In some implementations, three or more, particularly five or more isolating holders may be provided for attaching the electrode to the objective lens housing. Vibrations that are transferred to the electrode via the holders can be dampened by the plurality of damping units that are provided on the electrode.

According to another aspect described herein, an objective lens module 40 for focusing a charged particle beam on a specimen is provided. The objective lens module 40 includes a housing 41, particularly a grounded housing, and an electrode 20, particularly an electrode configured to be set on a high voltage with respect to the housing. At least one axially extending holder may hold the electrode at the housing. In other words, the holder may extend in a direction that is not perpendicular to the optical axis. In particular, the holder may extend essentially parallel to the optical axis A, as is schematically depicted in FIG. 6.

A damping unit, particularly a mass damper, may be provided on the electrode for damping vibrations of the electrode. Accordingly, even if the electrode is held with an axially extending holder, vibrations of the electrode can be effectively dampened by the damping unit that is mounted on the electrode. A small and stable focal spot on the specimen can be provided and a charged particle beam device with an improved resolution can be provided.

According to another aspect described herein, a method of inspecting a specimen is described, particularly a method of inspecting a specimen with any of the charged particle beam devices described herein.

Figure 7:
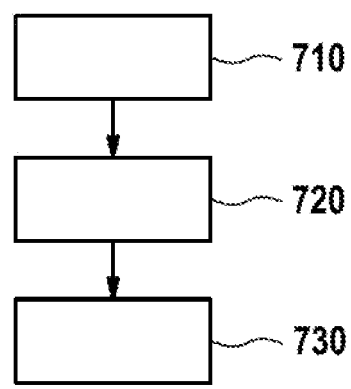
FIG. 7 is a flow diagram illustrating a method of inspecting a specimen according to embodiments described herein.

FIG. 7 is a flow diagram illustrating the method of inspecting a specimen, including, in box 710, generating a charged particle beam propagating along an optical axis.

In box 720, the charged particle beam is influenced with an electrode. For example, the electrode may at least one of collimate, deflect, focus, and correct the charged particle beam. In particular, the electrode may be a part of an objective lens module that focuses the charged particle beam on the specimen. Alternatively or additionally, the electrode may generate an extraction field for signal charged particles above the specimen. In one embodiment, the electrode is arranged close to the specimen, particularly at a distance of 2 cm or less, or 1 cm or less from the specimen. In particular, the electrode may be a proxy electrode that is arranged at a distance of 5 mm or less, or even 2 mm or less from the specimen.

In box 720, vibrations of the electrodes are damped with a damping unit that is provided on the electrode, particularly with a mass damper provided on the electrode. Drum modes and/or lateral modes may be damped. Specifically, drum modes and/or lateral modes of the electrode can be dampened with the damping unit, e.g. in a frequency range from 300 Hz to 2000 Hz, particularly from 300 Hz to 1000 Hz. A plurality of mass dampers may be mounted on a disk-shaped electrode body of the electrode.

In box 730, signal charged particles emitted and/or reflected by the specimen may be detected by a detection device, and spatial information about the specimen may be obtained.

While the foregoing is directed to embodiments, other and further embodiments may be devised without departing from the basic scope, and the scope thereof is determined by the claims that follow.

The invention claimed is:

1. A charged particle beam device for inspecting a specimen, comprising:
   a beam source for emitting a charged particle beam;
   an electrode for influencing the charged particle beam; and
   a damping unit provided on the electrode for damping vibrations of the electrode,
   wherein the damping unit is mounted at the electrode and not between the electrode and another object that can vibrate relative to each other,
   wherein the damping unit is a mass damper that comprises a damping mass and an elastic element arranged at least partially between the damping mass and the electrode, and
   wherein the damping unit is configured to dampen predetermined vibration modes of the electrode.

2. The charged particle beam device of claim 1, wherein the damping mass is held at a distance from the electrode by a connection element, and the elastic element is provided in contact with the electrode and the damping mass in a gap between the electrode and the damping mass.

3. The charged particle beam device of claim 2, wherein the connection element is a screw, pin or bolt, and the elastic element is an elastomer ring or O-ring surrounding the connection element.

4. The charged particle beam device of claim 1, wherein a surface of the damping unit protruding away from the electrode is at least one of rounded, edge- and corner-free, and polished.

5. The charged particle beam device of claim 1, wherein the electrode comprises a disk-shaped electrode body and a plurality of mass dampers mounted on the disk-shaped electrode body.

6. The charged particle beam device of claim 5, wherein the plurality of mass dampers comprise four, six or more mass dampers mounted on a circumferential edge region of the disk-shaped electrode body, respectively.

7. The charged particle beam device of claim 1, wherein the electrode is configured for at least one of focusing the charged particle beam on the specimen and generating an extraction field for signal electrons above the specimen.

8. The charged particle beam device of claim 1, wherein the charged particle beam device comprises an objective lens module for focusing the charged particle beam on the specimen, and the electrode is a part of the objective lens module arranged close to the specimen.

9. The charged particle beam device of claim 1, wherein the electrode is held at a housing of an objective lens module by at least one axially extending holder.

10. The charged particle beam device of claim 9, wherein the electrode is configured for a voltage difference of 1 kV or more with respect to the housing of the objective lens module.

11. The charged particle beam device of claim 1, wherein the electrode has a disk-shaped electrode body with a circumferential edge region having a first thickness and a center region with at least one opening for the charged particle beam having a second thickness smaller than the first thickness.

12. The charged particle beam device of claim 11, wherein the first thickness is 5 mm or more, and wherein the second thickness is 3 mm or less.

13. The charged particle beam device of claim 1, wherein the damping unit is configured to dampen vibration modes of the electrode in a frequency range from 300 Hz to 2000 Hz.

14. The charged particle beam device of claim 1, wherein the damping unit is configured to dampen drum modes of the electrode.

15. The charged particle beam device of claim 1, wherein the damping unit is configured to dampen lateral modes of the electrode.

16. The charged particle beam device of claim 1, wherein the electrode comprises an electrode body, and the damping unit is placed on the electrode body.

17. The charged particle beam device of claim 1, wherein the damping unit is not in contact with a support of the electrode.

18. An objective lens module for focusing a charged particle beam on a specimen, comprising:
   a housing;
   an electrode;
   at least one axially extending holder which holds the electrode at the housing; and
   a damping unit provided on the electrode for damping vibrations of the electrode,
   wherein the damping unit is mounted at the electrode and not between the electrode and another object that can vibrate relative to each other,
   wherein the damping unit is a mass damper that comprises a damping mass and an elastic element arranged at least partially between the damping mass and the electrode, and
   wherein the damping unit is configured to dampen predetermined vibration modes of the electrode.

19. An electrode device for influencing a charged particle beam in a charged particle beam device, comprising:
   an electrode body; and
   a mass damper mounted on the electrode body for damping vibrations of the electrode body,
   wherein the mass damper is mounted at the electrode body and not between the electrode body and another object that can vibrate relative to each other,
   wherein the mass damper comprises a damping mass and an elastic element arranged at least partially between the damping mass and the electrode body, and
   wherein the damping unit is configured to dampen predetermined vibration modes of the electrode body.

20. A method of inspecting a specimen with a charged particle beam device, comprising:
   generating a charged particle beam propagating along an optical axis;
   influencing the charged particle beam with an electrode; and
   damping vibrations of the electrode with a damping unit provided on the electrode,
   wherein the damping unit is mounted at the electrode and not between the electrode and another object that can vibrate relative to each other,
   wherein the damping unit is a mass damper that comprises a damping mass and an elastic element arranged at least partially between the damping mass and the electrode, and
   wherein the damping unit is configured to dampen predetermined vibration modes of the electrode.

21. The method of claim 20, wherein the electrode is arranged at a distance of 2 cm or less from the specimen and generates an extraction field for signal charged particles above the specimen.

* * * * *